United States Patent [19]

Sato et al.

[11] Patent Number: 5,242,853

[45] Date of Patent: Sep. 7, 1993

[54] MANUFACTURING PROCESS FOR A SEMICONDUCTOR DEVICE USING BIAS ECRCVD AND AN ETCH STOP LAYER

[75] Inventors: Junichi Sato, Tokyo; Tetsuo Gocho; Yasushi Morita, both of Kanagawa, all of Japan

[73] Assignee: Sony Corporation, Tokyo, Japan

[21] Appl. No.: 603,310

[22] Filed: Oct. 25, 1990

[30] Foreign Application Priority Data

Oct. 25, 1989 [JP] Japan .................................. 1-277929

[51] Int. Cl.[5] ..................... H01L 21/00; H01L 21/02; H01L 21/76
[52] U.S. Cl. ....................................... 437/67; 437/63; 437/64; 148/DIG. 50
[58] Field of Search ................... 437/67, 225, 228, 63, 437/64; 148/DIG. 50

[56] References Cited

U.S. PATENT DOCUMENTS

| | | | |
|---|---|---|---|
| 4,104,086 | 8/1978 | Bondur et al. | 437/67 |
| 4,274,909 | 6/1981 | Venkataraman et al. | 437/67 |
| 4,554,728 | 11/1985 | Shepard | 148/DIG. 50 |
| 4,666,556 | 5/1987 | Fulton et al. | 148/DIG. 50 |
| 4,851,366 | 7/1989 | Blanchard | 148/DIG. 50 |

FOREIGN PATENT DOCUMENTS

| | | |
|---|---|---|
| 0063917 | 11/1982 | European Pat. Off. . |
| 0367729 | 11/1982 | European Pat. Off. . |
| 0000942 | 1/1984 | Japan . |
| 0021540 | 2/1985 | Japan . |
| 0053045 | 3/1985 | Japan . |
| 0008945 | 1/1986 | Japan . |
| 0002554 | 1/1987 | Japan . |
| 0294050 | 12/1990 | Japan . |
| 0218049 | 9/1991 | Japan . |

OTHER PUBLICATIONS

Albas, S., Recessed Oxide Isolation Process, IBM Tech. Disclosure Bull., vol. 20, No. 1, Jun. 1977, pp. 144–145.

*Primary Examiner*—Brian E. Hearn
*Assistant Examiner*—B. Everhart
*Attorney, Agent, or Firm*—Hill, Van Santen, Steadman & Simpson

[57] ABSTRACT

A semiconductor device manufacturing process and a bias ECRCVD apparatus for the process. The semiconductor device manufacturing process comprises the steps of forming trenches in the surface of a substrate, forming an insulating film by bias ECRCVD over the surface of the substrate, etching the insulating film by lateral leveling etching so as to expand the width of grooves formed in portions of the insulating film which are formed in regions other than those corresponding to the trenches, masking the portions of the insulating film which fill the trenches and removing the portions of the insulating film formed in the regions other than those corresponding to the trenches. An etching stop layer is formed over the surface of the substrate before forming the trenches and the insulating film, and the etching stop layer is removed by etching after removing the portions of the insulating film which are formed in the regions other than those corresponding to the trenches by etching with the portions of the insulating film which fill up the trenches masked. The surfaces of the portions of the insulating film which fill up the trenches are finished so as to be flush with the surface of the substrate. Desirably, the etching stop layer is annealed so as to make the grains of the surface of the etching stop layer smooth so as to enable the complete removal of the portions of the insulating film formed in the regions other than those corresponding to the trenches.

4 Claims, 6 Drawing Sheets

ANISOTROPIC ETCHING

ISOTROPIC ETCHING

MANUFACTURING PROCESS FOR A SEMICONDUCTOR DEVICE USING BIAS ECRCVD AND AN ETCH STOP LAYER

BACKGROUND OF THE INVENTION

1. Field of the Invention

The present invention relates to a manufacturing process for a semiconductor device and, more particularly, to a manufacturing process for a semiconductor device in which trenches are formed in the surface of a substrate; after which an insulating film is formed over the surface of the substrate by bias ECRCVD so as to fill up the trenches; etching so as to level the insulating film so as to expand the width of the grooves which are formed in portions of the insulating film formed in regions (hereinafter referred to as "active regions") other than those portions which correspond to the trenches (hereinafter referred to as "trench regions"); and then removing those portions of the insulating film which are formed in the active regions after masking the portions of the insulating film which fill up the trenches. The invention also relates to a bias ECRCVD apparatus for manufacturing the semiconductor device.

2. Description of Related Art

It is a common practice to isolate the component elements of semiconductor devices, such as ICs, LSIs and VLSIs, by a selectively oxidized film (LOCOS) which is formed by selectively oxidizing the surface of the semiconductor substrate. However, the use of the selectively oxidized film for isolating the elements from each other causes the formation of bird's beaks which increase the critical dimension which increases the size of devices. Therefore, a trench-isolation method, which does not form any bird's beak and allows the devices to be very small is desirable.

A trench-isolation method, such as disclosed in Japanese Patent Laid-open (Kokai) No. 57-176742 or 60-53045, forms trenches in the surface of a semiconductor substrate, and fills up the trenches with $SiO_2$ which is deposited by bias ECRCVD. FIGS. 6A to 6E are sectional views showing the steps of a trench-isolation method, by way of example, employing bias ECRCVD. Trenches formed in the surface of a semiconductor substrate are filled up with an insulating film through the following steps of the trench-isolation method.

(A) As shown in FIG. 6A, trenches 2 are formed in the surface of a semiconductor substrate 1, and then an insulating film 3, i.e., a $SiO_2$ film, is formed over the surface of the semiconductor substrate 1 by bias ECRCVD so that the trenches 2 are filled up with the insulating film 3. The thickness of the insulating film 3 is substantially equal to the depth of the trenches 2. Portions 3a of the insulating film 3 are formed on the active regions on the surface of the semiconductor substrate 1.

(B) As shown in FIG. 6B, the portions 3a of the insulating film which are formed by bias ECRCVD are etched laterally as indicated by arrow by lateral leveling etching so that flat portions are not etched. The width of the grooves formed in the trench regions which corresponds to the trenches 2 in the portions 3a of the insulating film 3 is expanded by lateral leveling etching so as to facilitate masking the trenches 2 with a resist film.

(C) As shown in FIG. 6C, the portions of the insulating film 3 which are formed in the trenches 2 are masked with a resist film 4 by a process which uses a film of a resist material which is applied to the insulating film 3 through a photolithographic process.

(D) As shown in FIG. 6D, the portions 3a of the insulating film 3 which are formed in the active regions are removed by anisotropic etching using the masks of the resist film 4.

(E) As shown in FIG. 6E, the resist film 4 is then removed.

The trench-isolation method effectively utilizes the specific properties of ECRCVD so that the etching rate is smaller than the deposition rate, and the etching rate of the inclined surfaces which are inclined relative to the flat surface of the semiconductor substrate is larger than the deposition rate and is a substantial improvement in that the trench-isolation method is able to fill up comparatively narrow trenches and comparatively wide trenches with insulating films which have substantially the same thickness. Since the ordinary CVD process has good step coverage, the ordinary CVD process tends to form thick insulating films in narrow trenches and thin insulating films in wide trenches, whereas the bias ECRCVD process has less tendency to form insulating films in such a manner.

FIGS. 6A to 6E show an ideal configuration of the insulating film in the successive steps of the bias ECRCVD process. However, in a practical bias ECRCVD process, the side surfaces of the portions 3a of the insulating film formed in the active regions are curved slopes 5 as shown in FIG. 7 at a stage after the lateral leveling etching step (FIG. 6B), because the inclination of the slopes 5 to the surface of the substrate 1 is nearly zero as shown, and hence the slopes 5 are scarcely etched during lateral leveling etching. Accordingly, if the portions 3a of the insulating film 3 which are formed in the active regions and which have the slopes 5a in their side surfaces are etched by using the masks of the resist film 4, fragments of the portions 3a of the insulating film 3 will remain under the masks of the resist film 4 as shown in FIG. 8A when an anisotropic etching process is employed or portions of the insulating film 3 are formed in the trenches 2 are etched so as to form recesses 5b such as shown in FIG. 8B when an isotropic etching process is employed. Such portions of the insulating film reduce the dielectric strength of the isolation film.

When the portions 3a of the insulating film 3 are etched by anisotropic etching so as to secure spaces for forming the masks of the resist film 4, the portions of the insulating film which are formed in the trenches 2 are removed as shown in FIG. 9 and hence the trenches 2 are unsatisfactorily filled with the insulating film which reduces the dielectric strength of the isolation film.

SUMMARY OF THE INVENTION

Accordingly, it is an object of the present invention to provide a semiconductor device manufacturing process and a bias ECRCVD apparatus for the process which is capable of completely removing portions of an insulating film which is formed in active regions so that the trenches are satisfactorily filled up with the insulating film even if the side surfaces of the portions of the insulating film which are formed in the active regions are inclined surfaces.

In one aspect of the present invention, during a semiconductor device manufacturing process an etching stop layer is formed over the surface of a semiconductor substrate before forming trenches in the same surface.

In another aspect of the present invention, a bias ECRCVD apparatus uses a source gas for forming the insulating film and a source gas for etching the insulating film can be selectively supplied into a reaction chamber.

In a semiconductor device manufacturing process in accordance with the present invention, the surfaces of portions of an insulating film which fills up the trenches can be finished flush with the surface of the substrate by etching the portions of the insulating film which fills up the trenches to a depth which corresponds to the thickness of the etching stop layer, even if portions of the insulating film which fill up the trenches are partially removed during the anisotropic etching of portions of the insulating film which is formed in the active regions after the trenches and the insulating film have been formed. Accordingly, the trenches are filled with the insulating film, and the portions of the insulating film which are formed in the active regions can completely be removed, and the surfaces of the portions of the insulating film which fill the trenches are finished so that they are flush with the surface of the substrate.

A bias ECRCVD apparatus according to the present invention can selectively use different gases with a CVD step for forming an insulating film and then a step for etching the insulating film can successively be carried out which improves the yield of the semiconductor device manufacturing process.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure, and in which:

BRIEF DESCRIPTION OF THE DRAWINGS

FIG. 7 shows the slopes; and

FIGS. 8A and 8B show a stage after the removal of portions of an insulating film which are formed in active regions by anisotropic etching and by isotropic etching, respective, and FIG. 9 shows the result of anisotropic etching for securing an area which is to be covered with a resist film.

DETAILED DESCRIPTION OF THE PREFERRED EMBODIMENTS

A semiconductor device manufacturing process of a first embodiment according to the present invention will be described hereinafter with reference to FIGS. 1A to 1H.

Figure 1A:
FIGS. 1A to 1H are sectional views showing sequential steps of a semiconductor device manufacturing process for a first embodiment according to the present invention.

Step (A): As shown in FIG. 1A, an etching stop layer 6 of polycrystalline silicon for stopping the etching action on an insulating film during the filling up of trenches is formed over the surface of a semiconductor substrate 1. The thickness of the etching stop layer 6 is, for example, in the range of about 500 to about 2000 Å.

Figure 1B:
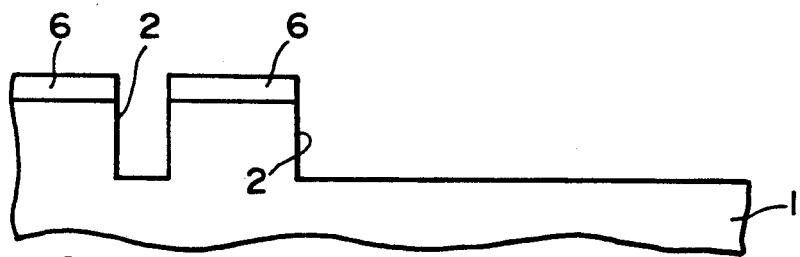

Step (B): As shown in FIG. 1B, trenches 2 are formed in the semiconductor substrate 1 by anisotropic etching.

Figure 1C:
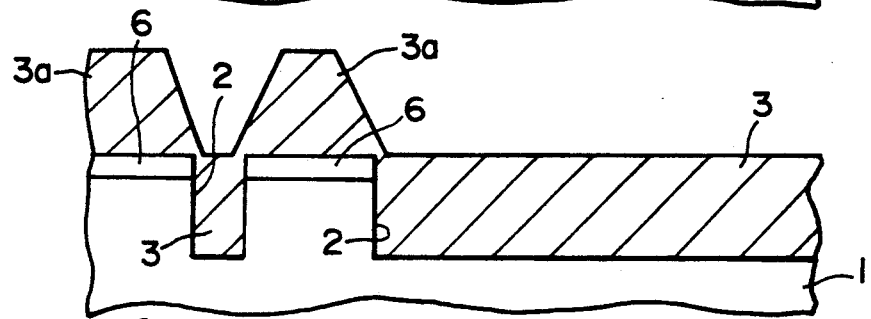

Step (C): As shown in FIG. 1C, an insulating film 3 of $SiO_2$ is formed on the semiconductor substrate 1 by bias ECRCVD so as to properly fill up the trenches 2. The conditions for the bias ECRCVD, for example, are: $SiH_4$ supply rate: 17.5 sccm, $N_2O$ supply rate: 35 sccm, power of the 2.45 GHz microwave: 1000 W, power of the RF bias: 500 W, the magnetic flux density: 875 gauss, and pressure: $7 \times 10^{-4}$. Portions 3a of the insulating film 3 are formed in active regions, namely, regions other than those corresponding to the trenches 2.

Figure 1D:
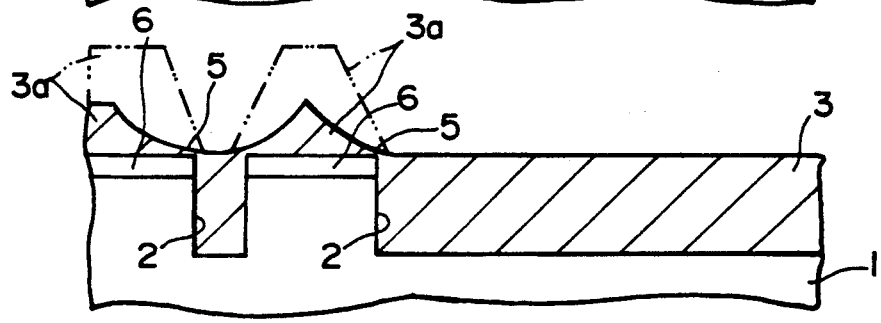

Step (D): As shown in FIG. 1D, the portions 3a of the insulating film 3 are subjected to bias ECRCVD for lateral leveling etching. The conditions for the bias ECRCVD are determined so that the flat portions are not etched. The conditions for the basis ECRCVD for the lateral leveling etching are the same as those for the bias ECRCVD for forming the insulating film 3, except that the $SiH_4$ supply rate is 7 sccm.

The step (D) shown in FIG. 1D is executed so as to secure spaces which are necessary for forming a resist film so as to positively mask portions of the insulating film 3 which fills the trenches 2 over and around the trenches 2. As stated above, since slopes 5 are formed, the spaces necessary for forming a satisfactory resist film are not obtained in step (D) which is shown in FIG. 1D. In FIG. 1D, indicated by alternate long and two short dashes lines are the shapes of the portions 3a of the insulating film 3 before the anisotropic etching.

Figure 1E:
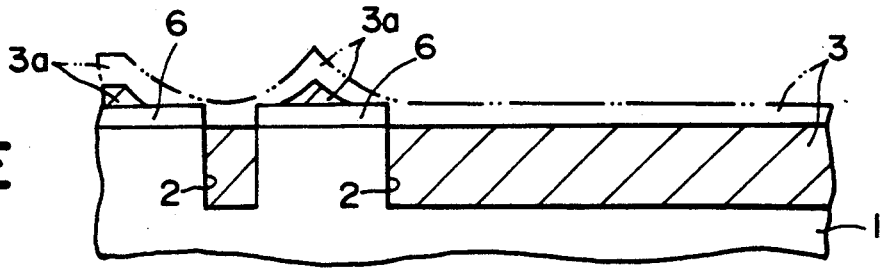

Step (E): As shown in FIG. 1E, the portions 3a of the insulating film 3 are subjected to RIE for anisotropic etching so as to etch the portions 3a to a depth corresponding to the thickness of the etching stop layer 6. The conditions for the anisotropic etching, for example, are: $CHF_3$ supply rate: 75 sccm, $O_2$ supply rate: 8 sccm, the power of RF bias: 1350 W, the pressure: 80 millitorr, and the etching mode: parallel flat plate RIE. Sufficient spaces for satisfactorily masking the portions of the insulating film 3 for filling the trenches 2 can be secured with step (E) as shown in FIG. 1E.

Figure 1F:
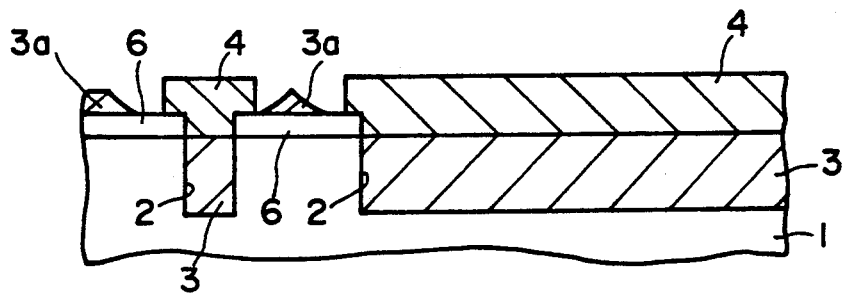

Step (F): As shown in FIG. 1F, portions of the insulating film 3 which fill the trenches 2 are masked with a resist film 4 by photolithography.

Figure 1G:
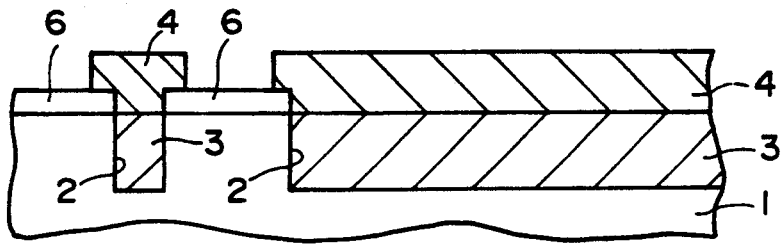

Step (G): As shown in FIG. 1G, the portions 3a of the insulating film 3 which are formed in the active regions are removed.

Figure 1H:
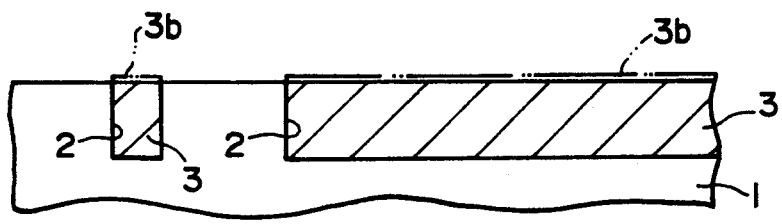

Step (H): As shown in FIG. 1H, the resist film 4 is removed, and then the etching stop layer 6, i.e., polycrystalline silicon film, is removed by etching using KOH.

Thus, the trenches 2 are properly filled with the insulating film 3 and the portions 3a of the insulating film 3 which are formed in the active regions are completely removed.

Thus, the semiconductor device manufacturing process comprises the sequential steps of forming the etching stop layer 6 over the surface of the semiconductor substrate 1, forming the trenches 2, forming the insulating film 3, subjecting the portions 3a of the insulating film 3 which are formed in the active regions to lateral leveling etching, and further subjecting the portions 3a to anisotropic etching. Consequently, the slopes in the portions 3a of the insulating film 3 which is formed in the active regions can be completely removed, and hence sufficient spaces for masking the portions of the insulating film 3 which fill the trenches with the resist film 4 can be secured and the portions 3a of the insulating film 3 can be completely removed.

Although the anisotropic etching subsequent to the lateral leveling etching etches the surfaces of the portions of the insulating film 3 which fill the trenches 2 to some extent, the surfaces of the portions of the insulating film 3 which fill the trenches 2 become flush with the surface of the semiconductor substrate 1 because the thickness of the insulating film 3 which is deposited is greater than the depth of the trenches 2 by the thickness of the etching stop layer 6.

Since the active regions, i.e., the regions other than the trench regions, of the semiconductor substrate 1 are covered with the etching stop layer 6 during the anisotropic etching, it is not possible for the surface of the semiconductor substrate 1 to be etched by the anisotropic etching.

During the insulating film 3 by anisotropic etching in step (E) as shown in FIG. 1E, the insulating film 3 may be etched by a depth which is slightly less than the thickness of the etching stop layer 6 so that the portions of the insulating film 3 which are formed in the trench regions protrude slightly above the surface of the semiconductor substrate 1 as indicated by the alternate long and two short dashes lines in FIG. 1H so as to secure sufficient dielectric strength at the shoulders or upper corners of the trenches 2, because the dielectric strength is not reduced even when the thickness of the insulating film 3 is greater than its design thickness, whereas the dielectric strength is reduced when the surfaces of the portions of the insulating film 3 which fill the trenches 2 are even a small distance below the surface of the semiconductor substrate 1. In FIG. 1H, portions 36 of the insulating film 3 protrude above the surface of the semiconductor substrate 1.

A bias ECRCVD apparatus for carrying out the semiconductor device manufacturing process described with reference to FIGS. 1A to 1H will be described with reference to FIG. 2.

The steps (C) and (D) (FIGS. 1C and 1D) of the semiconductor device manufacturing process require simple bias ECRCVD and hence the steps (C) and (D) can be carried out with an ordinary bias ECRCVD apparatus. However, anisotropic RIE, the step (E) (FIG. 1E) cannot be carried out with an ordinary bias ECRCVD apparatus. The bias ECRCVD apparatus of the present invention is capable of operating for anisotropic RIE.

Figure 2:
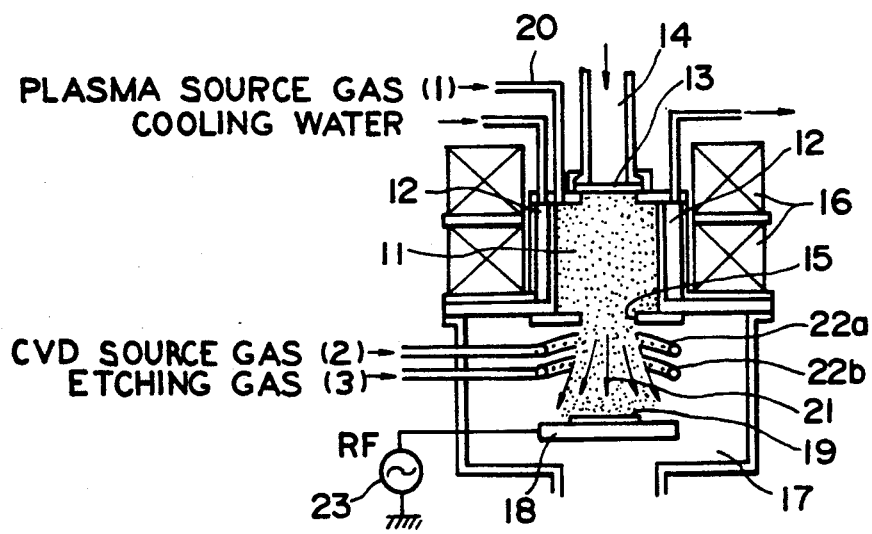
FIG. 2 is a schematic sectional view of a bias ECRCVD apparatus according to the present invention.

Referring to FIG. 2, there are shown a plasma producing chamber 11, a cooling water jacket 12, a microwave transmission window 13 formed of a quartz glass plate which is hermetically attached to the upper wall of the plasma producing chamber 11, a waveguide 14 which is placed on the upper wall of the plasma producing chamber 11, a plasma injecting opening 15 which is formed in the bottom wall of the plasma producing chamber 11. Exciting coils 16 surround the plasma producing chamber 11, a reaction chamber 17 is disposed under the plasma producing chamber 11 and a substrate support table 18 is disposed within the reaction chamber 17 directly under the plasma injecting opening 15 so as to support a semiconductor substrate 19. A gas supply pipe 20 for supplying a plasma source gas (1), such as $O_2$, into the plasma producing chamber 11, a plasma flow 21, a gas supply ring 22a for supplying a CVD source gas (2), such as $SiH_4$ for CVD into the reaction chamber 17, a gas supply ring 22b for supplying an etching gas, such as $CHF_3$ or $NF_3$, into the reaction chamber 17, and a bias RF power source 23 are also provided as shown.

The bias ECRCVD apparatus supplies the plasma source gas (1) and the CVD source gas (2) respectively into the plasma producing chamber 11 and the reaction chamber 17, energizes the exciting coils 16 so as to create a magnetic field which send microwaves into the plasma producing chamber 11 so as to produce a plasma by ionizing the plasma source gas (1). The ions of the plasma which are produced in the plasma producing chamber 11 are directed onto the semiconductor substrate 19 which has been placed on the substrate support table 18 which is disposed within the reaction chamber 17 by the divergent magnetic field which is created by the exciting coils 16. Then, the surface of the semiconductor substrate 19 is etched or a film is formed over the surface of the semiconductor substrate 19 by the vapor-phase reaction of the CVD source gas (2).

The RF bias power source 23 applies a bias to the substrate support table 18 so as to control the CVD of the insulating film. The flow rate of the CVD source gas (2) which is supplied through the gas supply ring 22a into the reaction chamber 17 is changed so as to change the operating mode from an insulating film CVD mode to a lateral leveling etching mode. Accordingly, the step (C) (FIG. 1C) for the CVD of the insulating film 3 and the step (D) (FIG. 1D) for the lateral leveling etching can be successively carried out.

Subsequently, the supply of the CVD source gas (2) through the gas supply ring 22a is stopped, and then an etching gas (3) for etching the insulating film, such as $CHF_3$ or $NF_3$, is supplied through the gas supply ring 22b for the anisotropic RIE of the insulating film 3 including the portions 3a which are formed in the active regions (FIG. 1E).

The bias ECRCVD apparatus in this embodiment is provided with the two gas supply rings 22a and 22b so as to supply the CVD source gas (2) through the gas supply ring 22a and to supply the etching gas (3) through the gas supply ring 22b. The bias ECRCVD apparatus may be provided with a single gas supply ring which is connected to an external selector means which selectively connects the gas supply ring to one of the gas sources so as to supply a desired source gas into the reaction chamber 17.

Thus, various modifications of the bias ECRCVD apparatus of the present invention are possible.

A semiconductor device manufacturing process of a second embodiment according to the present invention will be described hereinafter with reference to FIGS. 3A to 3D.

Figure 3A:
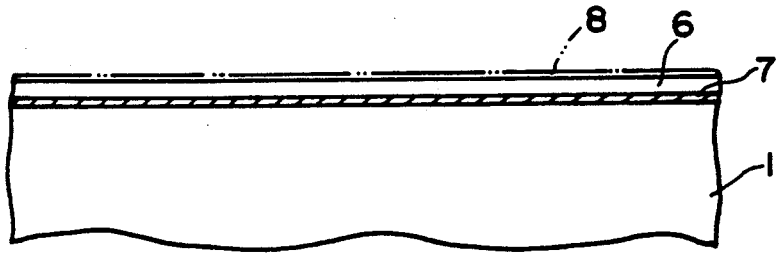
FIGS. 3A to 3D are sectional views showing sequential steps of a semiconductor device manufacturing process for a second embodiment according to the present invention.

Step (A): As shown in FIG. 3A, a pad layer 7 having a thickness in the range of 50 to 100 Å of, for example, $SiO_2$ and an etching stop layer 6 of polycrystalline silicon are formed in that order over the surface of a semiconductor substrate 1. The etching stop layer 6 may be coated with a capping layer 8 of SiO2 or SiN as indicated by an alternate long and two short dashes line so as to prevent the oxidation of the etching stop layer 6 during the next annealing process which uses a laser beam.

Figure 3B:
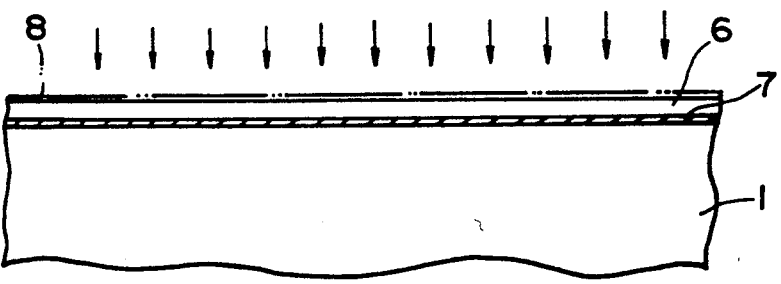

Step (B): As shown in FIG. 3B, the grains of the polycrystalline silicon which form the etching stop layer 6 are made to properly grow by heating only the etching stop layer 6 for annealing with a laser beam which is emitted by an excimer laser for the following purpose. When the insulating film 3 including the portions 3a which are etched by anisotropic etching as shown in FIG. 1E, a small amount of SiO2 which is deposited by the bias ECRCVD process remains between the grains of the etching stop layer 6, and the residual SiO2 must be removed or it is possible that the etching stop layer 6 cannot be removed by etching using KOH. Since the etching stop layer 6 which is formed by CVD has an irregular surface and grain boundaries in the surface, the portions 3a of the insulating film of SiO2 are formed in a complex configuration along the grain boundaries and irregularities occur in the surface from the bias ECRCVD process. Such a complex insulating film 3 cannot readily be removed in a short time by etching using hydrofluoric acid (HF). If the etching for removing the portions 3a of the insulating film 3 is continued for a long time so as to remove it completely, it is possible that the surfaces of the portions of the insulating film which formed in the trench regions will be etched. Therefore, the grains of the etching stop layer 6 which are formed by CVD are made to grow by annealing the etching stop player 6 with a laser beam so as to smooth the irregular surfaces of the etching stop layer 6 so that fragments of the SiO2 film remaining in the grain boundaries can readily be removed with hydrofluoric acid. The step (B), the annealing process, distinguishes the bias ECRCVD process in the second embodiment from the bias ECRCVD process illustrated in FIGS. 1A to 1H of the first embodiment.

Figure 3C:
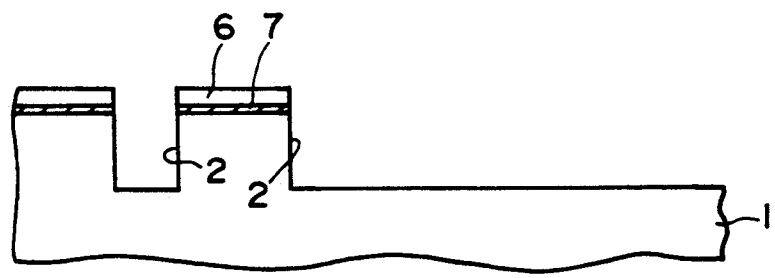

Step (C): As shown in FIG. 3C, trenches 2 are formed in the surface of the semiconductor substrate 1 by anisotropic etching.

Figure 3D:
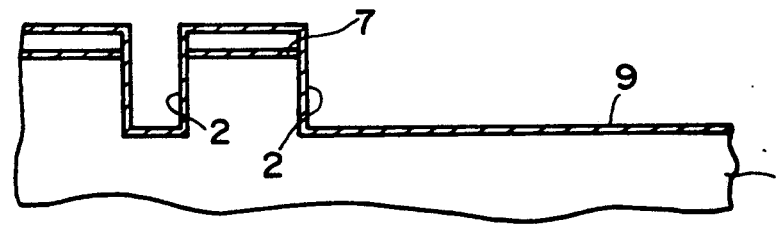

Step (D): As shown in FIG. 3D, SiO2 films 9, i.e. passivation films, are formed over the side surfaces and bottom surfaces of the trenches 2 by thermal oxidation.

After the step (D) shown in FIG. 3D, the third process (FIG. 1C) and the following steps of the bias ECRCVD process in the first embodiment are executed for trench isolation.

Since the surface of the etching stop layer 6 which is formed by the semiconductor device manufacturing process in the second embodiment remains smooth after it has been used, the SiO2 film can readily be removed, and hence the etching stop layer 6 also can readily be removed.

A semiconductor device manufacturing process of a third embodiment according to the present invention will be described hereinafter with reference to FIGS. 4A to 4D.

Figure 4A:
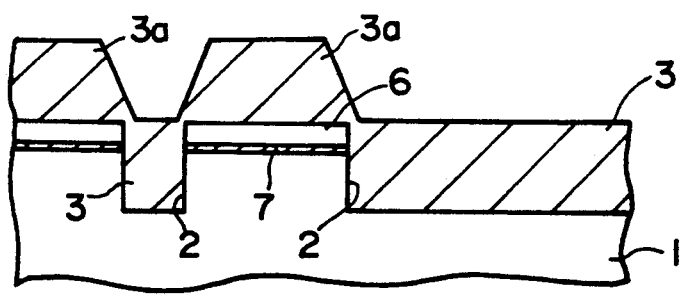
FIGS. 4A to 4D are sectional views showing sequential steps of a semiconductor device manufacturing process for a third embodiment according to the present invention.

Step (A): As shown in FIG. 4A a pad layer 7 and an etching stop layer 6 of polycrystalline silicon are formed in that order over the surface of a semiconductor substrate 1. The etching stop layer 6 which is similar to the etching stop layer 6 formed in the second embodiment, may be annealed with a laser beam. Trenches 2 are formed in the semiconductor substrate 1, and then the trenches 2 are completely filled with an insulating film 3 as shown in FIG. 4A by bias ECRCVD.

Figure 4B:
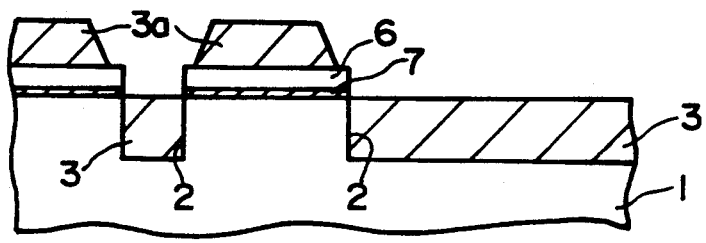

Step (B): As shown in FIG. 4B, the insulating film 3 including portions 3a formed in the active regions is etched by anisotropic etching to a depth which is substantially equal to the thickness of the etching stop layer 6.

Figure 4C:
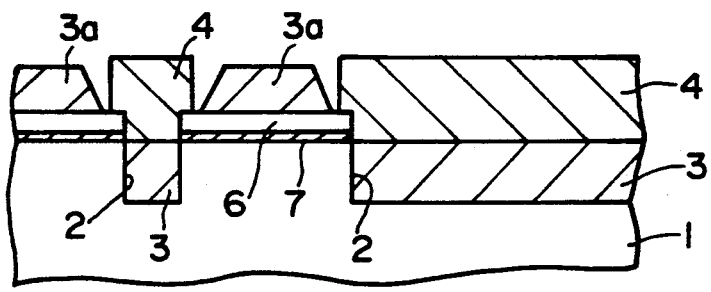

Step (C): As shown in FIG. 4C, portions of the insulating film 3 which are formed in the trenches 2 are masked with a resist film 4.

Figure 4D:
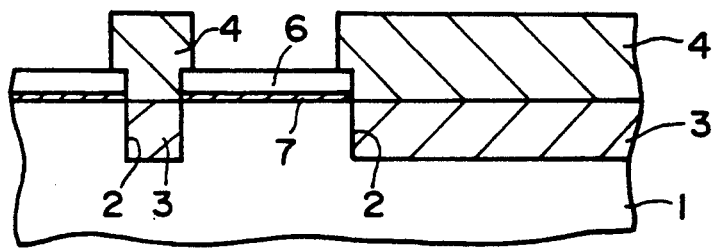

Step (D): As shown in FIG. 4D, the portions 3a of the insulating film which are formed in the active regions are removed by etching using the masks of the resist film 4.

Subsequently, the resist film 4 is removed, the etching stop layer 6 is removed by etching using KOH, and the pad layer 7 is removed by using hydrofluoric acid.

In the third embodiment, the step of basis ECRCVD for forming the insulating film 3 is followed by the step (B) for anisotropic etching, and the step of lateral leveling etching by bias ECRCVD is omitted. Thus, spaces which are necessary for forming the masks of the resist film 4 for etching so as to remove the portions 3a of the insulating film formed in the active regions are formed only by step (B) for anisotropic etching. The formation of the portions 3a of the insulating film 3 by bias ECRCVD and the anisotropic etching in the step (B) can be carried out successively by the bias ECRCVD apparatus shown in FIG. 2.

Figure 5:
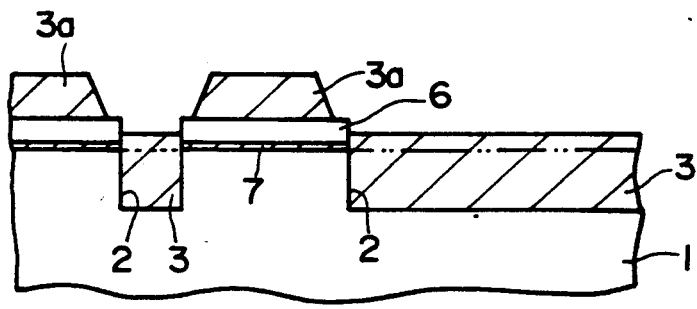
FIG. 5 is a sectional view of explaining a modification of the semiconductor device manufacturing process shown in FIGS. 4A to 4D.
Figure 6A:
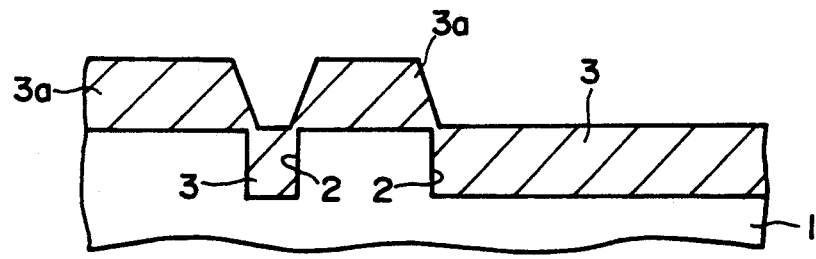
FIGS. 6A to 6E are sectional views showing sequential steps of a conventional semiconductor device manufacturing process.
Figure 6B:
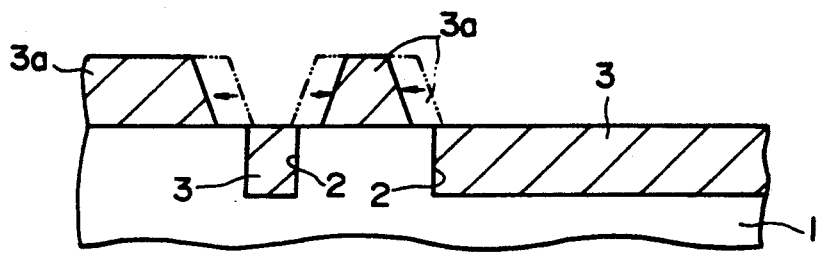
Figure 6C:
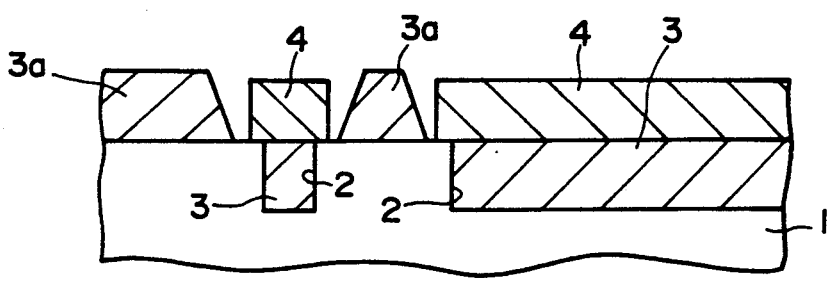
Figure 6D:
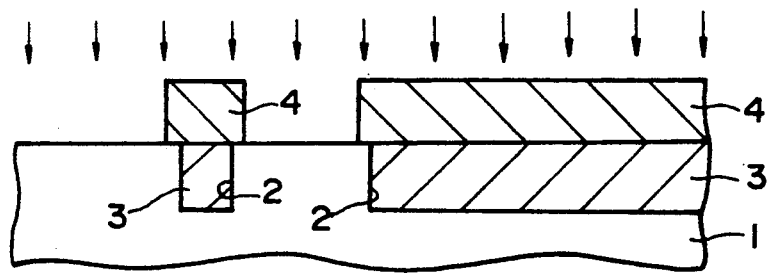
Figure 6E:
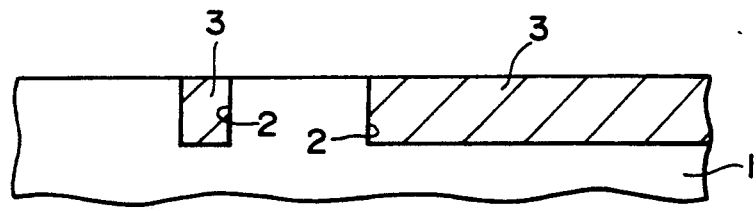
Figure 7:
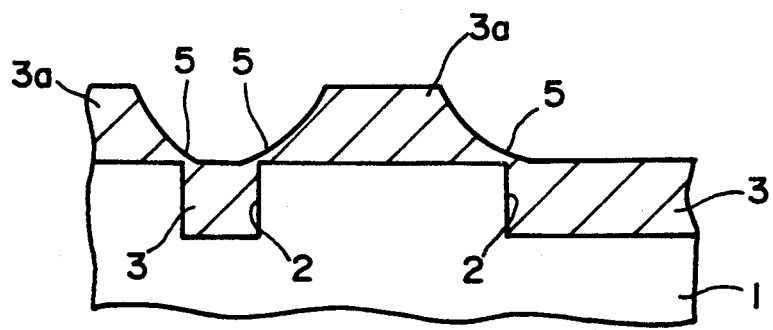
FIGS. 7, 8A, 8B and 9 are sectional views used for explaining the problems which are to be solved by the present invention.
Figure 8A:
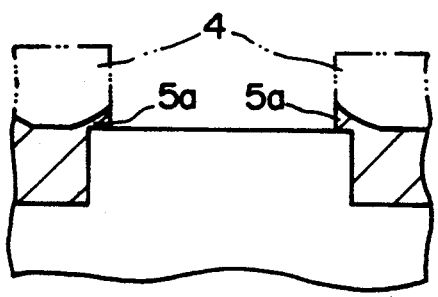
Figure 8B:
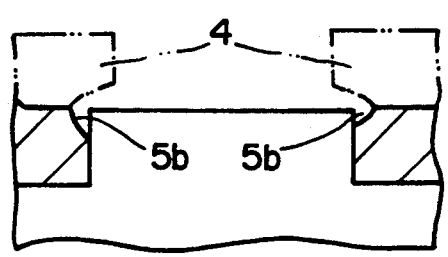
Figure 9:
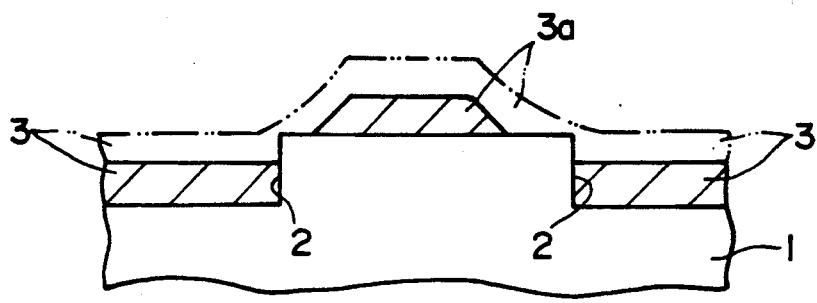

FIG. 5 shows a modification in the semiconductor device manufacturing process of the third embodiment which was described with reference to FIGS. 4A to 4D. In a step of this modification corresponding to the step (B) of the semiconductor device manufacturing process in the third embodiment, the insulating film 3 including the portions 3a is etched by anisotropic etching to a depth which is slightly smaller than the thickness of the etching stop layer 6 so that the level of the surface of the insulating film 3 is higher than the surface of the semiconductor substrate 1 which is indicated by an alternate long and two short dashes line in FIG. 5 so as to prevent a deficiency in the dielectric strength of a layer of insulating film which is to be formed during the following process in portions corresponding to the shoulders or corners of the trenches 2 by completely filling th trenches 2 with the insulating film 3.

As is apparent from the foregoing description, according to the present invention, an etching stop layer resistant to etching actions for etching an insulating film is formed over the surface of a substrate before forming trenches in the substrate, an insulating film is formed on the substrate so as to fill up the trenches, portions of the insulating film which were formed in active regions are removed by etching with portions of the insulating film which fill the trenches being masked, and then the etching stop layer is removed.

Accordingly, only small portions of the portions of the insulating film which fill up the trenches which protrude from the surface of the substrate are removed when the insulating film is etched by anistropic etching to a depth corresponding to the thickness of the etching stop layer, and hence the surfaces of the portions of the insulating film which fill the trenches are finished so as to be flush with the surface of the substrate.

Furthermore, annealing of the etching stop layer formed of polycrystalline silicon which makes the grains of th etching stop layer grow makes the surface of the etching stop layer smooth, so that the insulating film formed over the etching stop layer can be completely removed, and hence the etching stop layer can readily be removed.

The bias ECRCVD apparatus in accordance with the present invention is able to selectively use desired gases so as to successively carry out CVD and etching, which improves the output of the semiconductor device manufacturing process.

Although the invention has been described with respect to preferred embodiments, it is not to be so limited as changes and modifications can be made which are within the full intended scope of the invention as defined by the appended claims.

We claim as our invention:

1. A process for manufacturing a semiconductor device comprising the steps of:
   forming trenches in the surface of a substrate;
   forming an insulating film by bias ECRCVD on the surface of the substrate so as to fill said trenches;
   etching said insulating film by lateral leveling etching so as to expand the width of said grooves which are formed in portions of said insulating film which is formed in regions other than those corresponding to said trenches;
   masking said portions of said insulating film which fill said trenches; and
   removing said portions of said insulating film which is formed in said regions other than those corresponding to said trenches;
   characterized in that an etching stop layer which is resistant to etching actions for etching said insulating film is formed over the surface of said substrate before forming said trenches and said insulating film, and said etching stop layer is removed by etching after removing said portions of said insulating film which are formed in said regions other than those corresponding to said trenches by etching with said portions of the insulating film which fill said trenches being masked.

2. A process for manufacturing a semiconductor device according to claim 1, wherein said etching stop layer is formed of polycrystalline silicon, and said etching stop layer is annealed so as to cause polycrystalline silicon grains to grow.

3. A process for manufacturing a semiconductor device comprising the steps of:
   forming trenches in the surface of a substrate;
   forming an insulating film by bias ECRCVD on the surface of the substrate so as to fill said trenches;
   masking said portions of said insulating film which fill said trenches; and
   removing said portions of said insulating film which is formed in said regions other than those corresponding to said trenches;
   characterized in that an etching stop layer which is resistant to etching action for etching said insulating film is formed over the surface of said substrate before forming said trenches and said insulating film and said etching stop layer is removed by etching after removing said portions of said insulating film which are formed in said regions other than those corresponding to said trenches by etching with said portions of the insulating film which fill said trenches being masked.

4. A manufacturing process for a semiconductor according to claim 3 wherein the etching of said insulating in said portions is done by anisotropic etching to a depth which is slightly less than the thickness of said etching stop layer.

* * * * *